United States Patent
Noh

(10) Patent No.: US 9,514,847 B2
(45) Date of Patent: Dec. 6, 2016

(54) SEMICONDUCTOR DEVICE AND OPERATION METHOD THEREOF

(71) Applicant: SK hynix Inc., Gyeonggi-do (KR)

(72) Inventor: Young-Kyu Noh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 81 days.

(21) Appl. No.: 14/523,579

(22) Filed: Oct. 24, 2014

(65) Prior Publication Data

US 2015/0364217 A1   Dec. 17, 2015

(30) Foreign Application Priority Data

Jun. 16, 2014  (KR) .................. 10-2014-0072892

(51) Int. Cl.

| | | |
|---|---|---|
| G11C 29/44 | (2006.01) | |
| G11C 29/54 | (2006.01) | |
| G11C 17/16 | (2006.01) | |
| G11C 29/12 | (2006.01) | |

(52) U.S. Cl.
   CPC .............. *G11C 29/44* (2013.01); *G11C 17/16* (2013.01); *G11C 2029/1208* (2013.01); *G11C 2029/4402* (2013.01)

(58) Field of Classification Search
   CPC . G11C 29/44; G11C 17/16; G11C 2029/1208; G11C 2029/4402
   See application file for complete search history.

(56) References Cited

U.S. PATENT DOCUMENTS

| | | | |
|---|---|---|---|
| 6,181,615 B1 * | 1/2001 | Chhor ................ | G01R 31/317 |
| | | | 365/201 |
| 6,667,902 B2 | 12/2003 | Peng | |
| 6,777,757 B2 | 8/2004 | Peng et al. | |
| 6,940,751 B2 | 9/2005 | Peng et al. | |
| 7,173,851 B1 | 2/2007 | Callahan et al. | |
| 7,269,047 B1 | 9/2007 | Fong et al. | |
| 2004/0017718 A1 * | 1/2004 | Ooishi ............... | G11C 11/16 |
| | | | 365/210.1 |
| 2008/0247261 A1 * | 10/2008 | Ishikawa ............ | G11C 7/1045 |
| | | | 365/230.08 |
| 2011/0271141 A1 * | 11/2011 | Kursun ............... | G06F 11/008 |
| | | | 714/6.3 |
| 2014/0043051 A1 * | 2/2014 | Iwatsu .............. | G01R 31/31919 |
| | | | 324/750.01 |

FOREIGN PATENT DOCUMENTS

| | | |
|---|---|---|
| KR | 1020080103538 | 11/2008 |
| KR | 101075495 | 10/2011 |

* cited by examiner

*Primary Examiner* — April Y Blair
*Assistant Examiner* — Dipakkumar Gandhi
(74) *Attorney, Agent, or Firm* — IP & T Group LLP

(57) ABSTRACT

A semiconductor device includes a latch circuit suitable for storing a test result; a non-volatile memory circuit suitable for storing information used for an operation of the semiconductor device; a decoding unit suitable for generating one or more internal program commands by using one or more control signals; and a control unit suitable for programming information in the non-volatile memory circuit in response to the test result stored in the latch circuit when the internal program commands are activated.

9 Claims, 6 Drawing Sheets

SEMICONDUCTOR DEVICE AND OPERATION METHOD THEREOF

CROSS-REFERENCE TO RELATED APPLICATIONS

The present application claims priority of Korean Patent Application No. 10-2014-0072892, filed on Jun. 16, 2014, which is incorporated herein by reference in its entirety.

BACKGROUND

1. Field

Various embodiments of the present invention relate to a technology for recording information used for operating a semiconductor device.

2. Description of the Related Art

FIG. 1 is a block view illustrating a repair operation of a typical memory device.

Referring to FIG. 1, the memory device includes a cell array 110, a row circuit 120, and a column circuit 130. The cell array 110 includes a plurality of memory cells. The row circuit 120 activates a word line selected based on a row address R_ADD. The column circuit 130 accesses (reads or writes) the data of a bit line selected based on a column address C_ADD.

A row fuse circuit 140 stores a row address corresponding to a failed memory cell of the cell array 110 as a repair row address REPAIR_R_ADD. A row comparison circuit 150 compares the repair row address REPAIR_R_ADD stored in the row fuse circuit 140 with the row address R_ADD inputted from the exterior (an external source) of the memory device. When the repair row address REPAIR_R_ADD coincides with the row address R_ADD, the row comparison circuit 150 controls the row circuit 120 to activate a redundancy word line instead of the word line designated by the row address R_ADD.

A column fuse circuit 160 stores a column address corresponding to a failed memory cell of the cell array 110 as a repair column address REPAIR_C_ADD. A column comparison circuit 170 compares the repair column address REPAIR_C_ADD stored in the column fuse circuit 160 with the column address C_ADD inputted from the exterior of the memory device. When the repair column address REPAIR_C_ADD coincides with the column address C_ADD, the column comparison circuit 170 controls the column circuit 130 to select a redundancy bit line instead of the bit line designated by the column address C_ADD.

Conventional fuse circuits 140 and 160 usually use laser fuses. A laser fuse stores data of a logic high level or a logic low level according to whether a fuse is cut. Laser fuses may be programmed when they are in the wafer stage. However, once the wafer is mounted on a package, the fuse can no longer be programmed. Moreover, due to its pitch limitations, the laser fuse takes up a significant amount of chip area.

To overcome these drawbacks, U.S. Pat. No. 6,940,751, U.S. Pat. No. 6,777,757, U.S. Pat. No. 6,667,902, U.S. Pat. No. 7,173,851, and U.S. Pat. No. 7,269,047 disclose technology of mounting a non-volatile memory circuit, such as an e-fuse array circuit, a NAND flash memory, a NOR flash memory, an Erasable Programmable Read Only Memory (EPROM), an Electrically Erasable Programmable Read Only Memory (EEPROM), a Ferroelectric Random Access Memory (FRAM), a Magnetoresistive Random Access Memory (MRAM) and so forth, inside of a memory device, and storing repair information in the non-volatile memory circuit.

FIG. 2 is a block view illustrating a non-volatile memory circuit used in a memory device to store repair information.

Referring to FIG. 2, the memory device includes a plurality of memory banks BK0 to BK3, repair information registers 210_0 to 210_3, a configuration information register 210_4, a configuration circuit 220, and a non-volatile memory circuit 201.

The repair information registers 210_0 to 210_3 are provided for the memory banks BK0 to BK3, respectively, and store repair information. The configuration information register 210_4 stores configuration information.

The non-volatile memory circuit 201 substitutes the row fuse circuit 140 and the column fuse circuit 160. The non-volatile memory circuit 201 stores repair information, which includes repair addresses corresponding to all the memory banks BK0 to BK3. Also, the non-volatile memory circuit 201 stores configuration information used for the operation of the memory device. The non-volatile memory circuit 201 may be one among an e-fuse array circuit, a NAND flash memory, a NOR flash memory, an EPROM, an EEPROM, an FRAM, an MRAM and so forth.

Each of the repair information registers 210_0 to 210_3 stores repair information for their corresponding memory banks BK0 to BK3, respectively. The repair information register 210_0 stores repair information of the memory bank BK0, and the repair information register 210_2 stores repair information of the memory bank BK2, and so on. The configuration information register 210_4 stores configuration information to be used in the configuration circuit 220. The configuration circuit 220 may set internal voltage levels and latencies that are to be used for the operation of the memory device based on the configuration information stored in the configuration information register 210_4. The repair information registers 210_0 to 210_3 and the configuration information register 210_4 may store the repair information only while power is supplied. The repair information and the configuration information, to be stored in the repair information registers 210_0 to 210_3 and the configuration information register 210_4, are transmitted from the non-volatile memory circuit 201. The non-volatile memory circuit 201 transmits the repair information and the configuration information when a bootup signal BOOTUP is activated to the repair information registers 210_0 to 210_3 and the configuration information register 210_4.

Since the non-volatile memory circuit 201 is in an array, it takes a predetermined time to read the data stored therein. In short, since the data stored in the non-volatile memory circuit 201 may not be read immediately, it is impossible to perform a repair operation by using the data stored in the non-volatile memory circuit 201 directly. Therefore, the repair information and the configuration information that is stored in the non-volatile memory circuit 201 is transmitted to and stored in the repair information registers 210_0 to 210_3 and the configuration information register 210_4, and the data stored in the repair information registers 210_0 to 210_3 and the configuration information register 210_4 is used for the repair operations of the memory banks BK0 to BK3 and the setup operations of the configuration circuit 220. The process where the repair information and the configuration information, stored in the non-volatile memory circuit 201, is transmitted to the repair information registers 210_0 to 210_3 and the configuration information register 210_4 is called a bootup operation. The memory device may only perform normal operations when the bootup operation is completed, so that the repair information registers 210_0 to 210_3 and the configuration information register 210_4 are setup and are ready to function.

To program the information used for the operation of the memory device (such as repair information and diverse configuration informations) in the non-volatile memory circuit 201, (1) the memory device has to go through a test performed by testing equipment, and (2) the test result has to be transmitted from the memory device to the testing equipment, and (3) the test result has to be analyzed and information generated based on the test result has to be programmed in the non-volatile memory circuit 201. These processes require a significant amount of time, and when tens of thousands of memory devices are tested, analyzing the test results of the tens of thousands of memory devices and programming different information in the tens of thousands of memory devices is complicated and time consuming.

SUMMARY

An embodiment of the present invention is directed to a technology for programming information in a non-volatile memory circuit in a semiconductor device based on a test result of the semiconductor device.

In accordance with an embodiment of the present invention, a semiconductor device includes a latch circuit suitable for storing a test result; a non-volatile memory circuit suitable for storing information used for an operation of the semiconductor device; a decoding unit suitable for generating one or more internal program commands by using one or more control signals; and a control unit suitable for programming information in the non-volatile memory circuit in response to the test result stored in the latch circuit when the internal program commands are activated.

The latch circuit may store information of pass or failure. The internal program commands may include a pass program command and a failure program command.

The control unit may program the information inputted from the exterior of the semiconductor device in the non-volatile memory circuit, when the pass program command is enabled and information of pass is stored in the latch circuit, and the control unit may not program the information inputted from the exterior of the semiconductor device in the non-volatile memory circuit, when the pass program command is activated and the information of failure is stored in the latch circuit. The control unit may program the information inputted from the exterior of the semiconductor device in the non-volatile memory circuit, when the failure program command is enabled and information of failure is stored in the latch circuit, and the control unit may not program the information inputted from the exterior of the semiconductor device in the non-volatile memory circuit, when the failure program command is enabled and information of pass is stored in the latch circuit.

In accordance with another embodiment of the present invention, a semiconductor device includes: a latch circuit suitable for storing a test result corresponding to a pass or failure; a non-volatile memory circuit; and a control unit suitable for selectively programming information in the non-volatile memory circuit when a pass/failure program command corresponds to the test result stored in the latch circuit.

In accordance with yet another embodiment of the present invention, a method for operating a semiconductor device includes: performing a test to produce a test result; temporarily storing the test result; receiving a program command and information corresponding to the program command; and programming the information in a non-volatile memory circuit based on the temporarily stored test result.

In the programming of the information in the non-volatile memory circuit based on the temporarily stored test result, the information is programmed in the non-volatile memory circuit when the program command is a pass program command and the temporarily stored test result is information of pass, and when the program command is a pass program command and the temporarily stored test result is information of failure, the information is not programmed in the non-volatile memory circuit. In the programming of the information in the non-volatile memory circuit based on the temporarily stored test result, the information is programmed in the non-volatile memory circuit, when the program command is a failure program command and the temporarily stored test result is information of failure, and when the program command is a failure program command and the temporarily stored test result is information of pass, the information is not programmed in the non-volatile memory circuit.

In accordance with yet another embodiment of the present invention, a semiconductor device includes: a latch circuit suitable for storing a test result; a non-volatile memory circuit suitable for storing information used for an operation of the semiconductor device; a decoding unit suitable for generating one or more internal program commands by using one or more control signals inputted from an exterior of the semiconductor device; and a control unit suitable for programming information inputted, from the exterior of the semiconductor device, into the non-volatile memory circuit, depending on the test result.

The test result may not be communicated to the exterior of the semiconductor device. The test result may be pass or fail information. The test result may be a frequency or information corresponding to a frequency.

In accordance with yet another embodiment of the present invention, a method for testing a semiconductor device includes: performing a test to produce a test result; temporarily storing the test result; applying a program command and information corresponding to the program command; programming the information in a non-volatile memory circuit based on the temporarily stored test result; and never communicating the test result outside of the semiconductor device.

DETAILED DESCRIPTION

Figure 1:
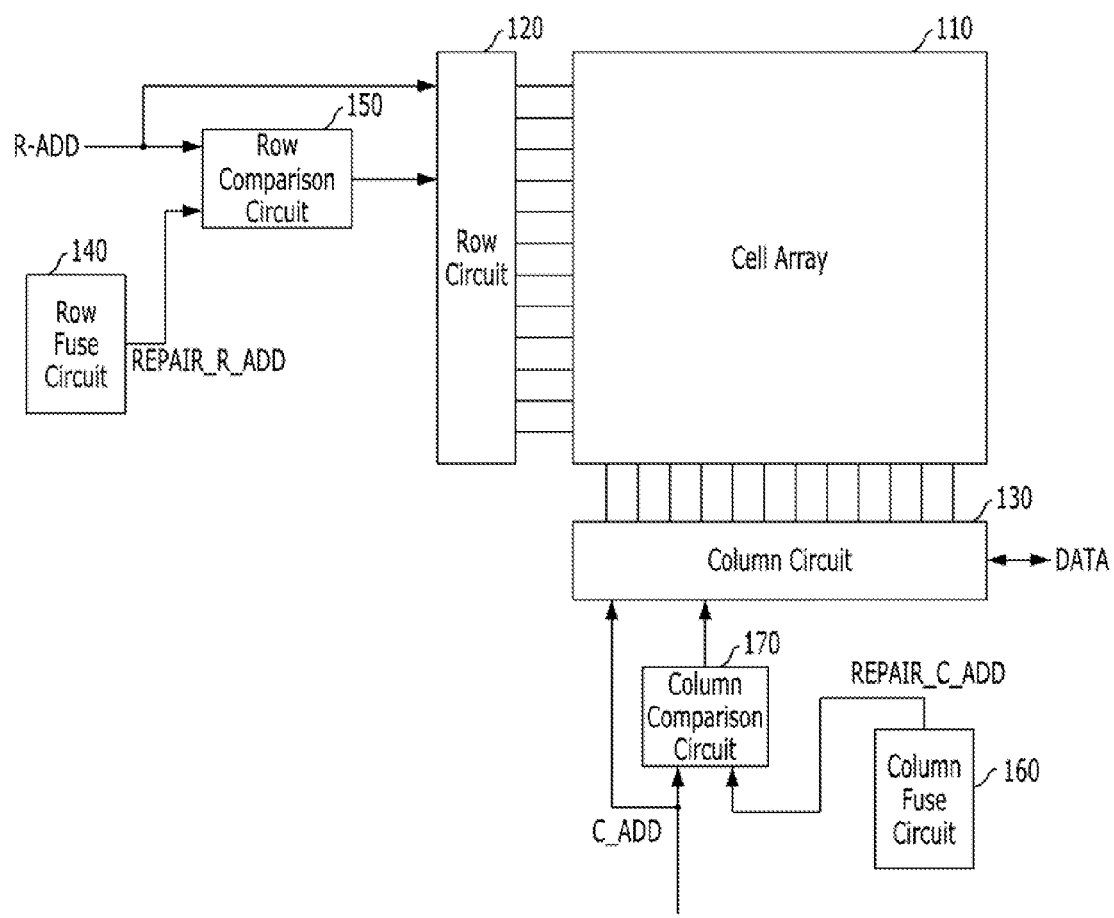
FIG. 1 is a block view illustrating a repair operation of a typical memory device.
Figure 2:
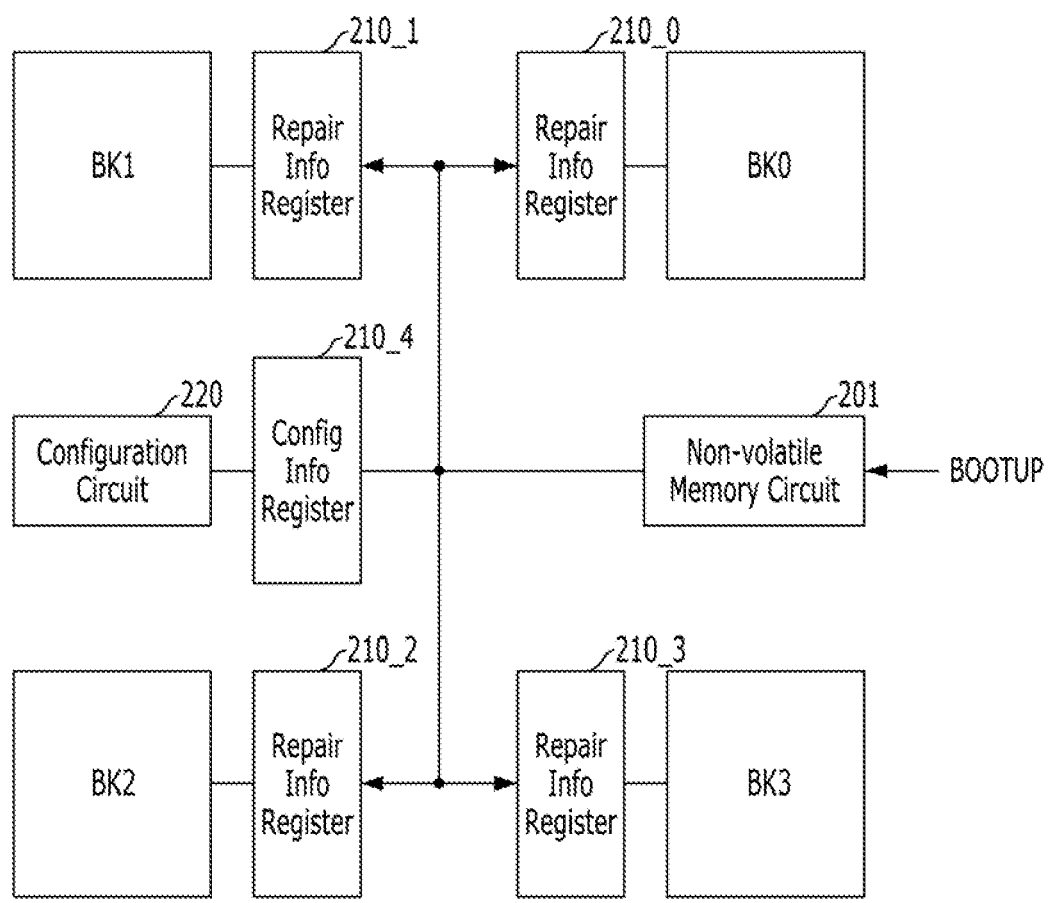
FIG. 2 is a block view illustrating a non-volatile memory circuit used in a memory device to store repair information.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
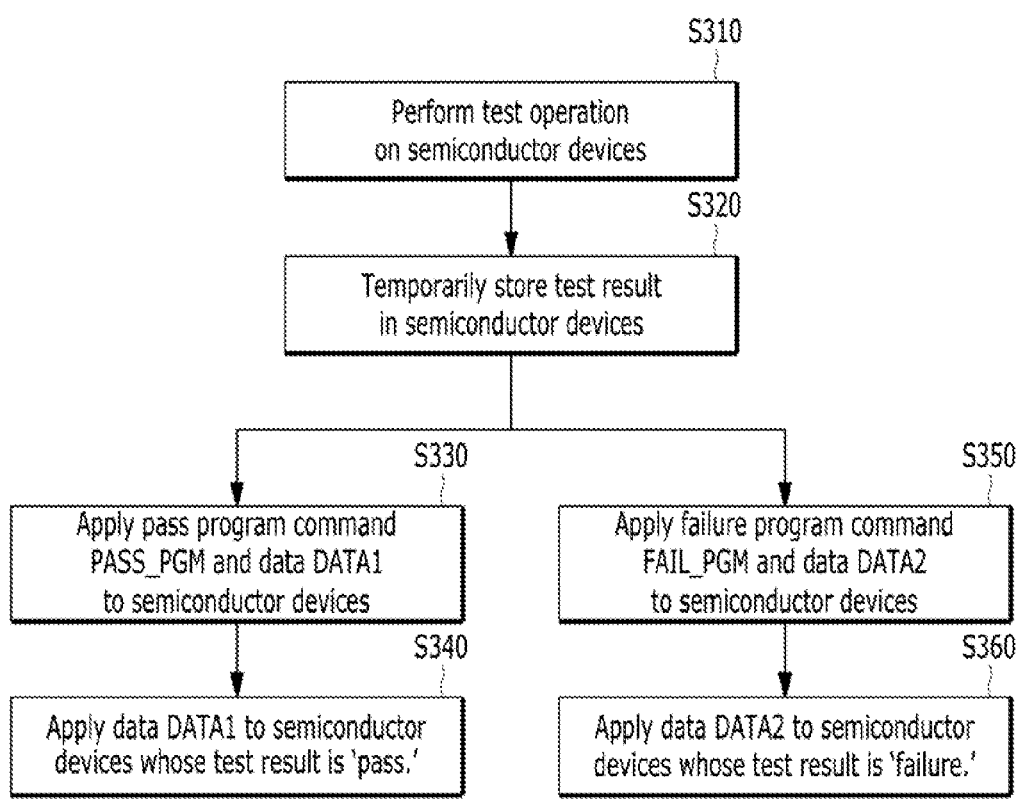
FIG. 3 is a flowchart describing an operation of a semiconductor device in accordance with an embodiment of the present invention.
Figure 4:
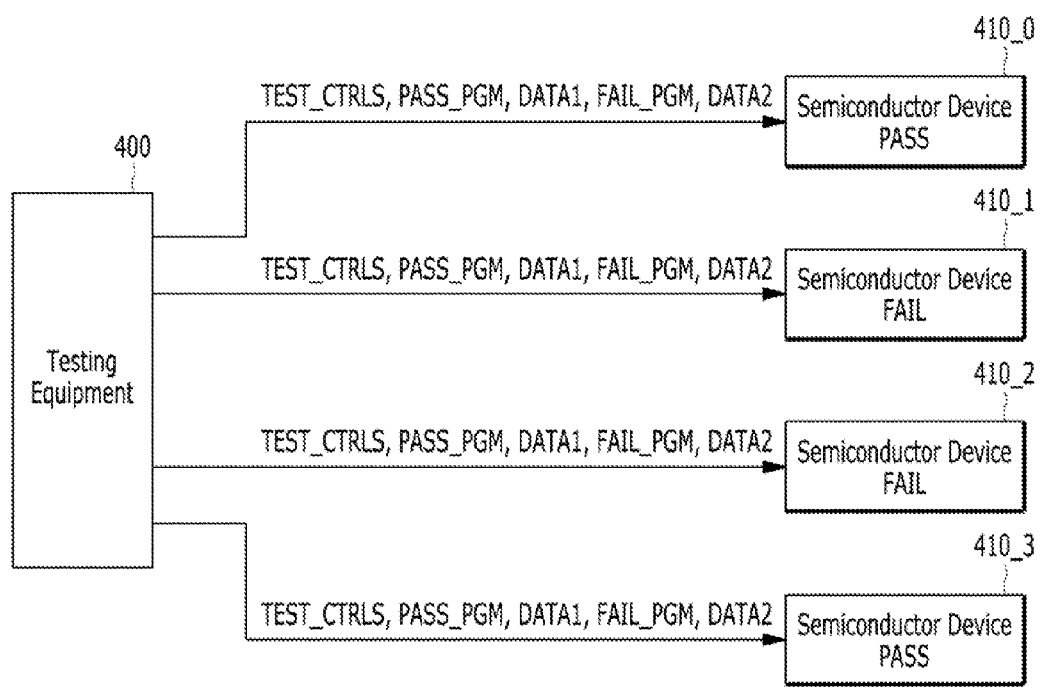
FIG. 4 is block view illustrating testing equipment and semiconductor devices that are tested by the testing equipment.

FIG. 3 is a flowchart describing an operation of a semiconductor device in accordance with an embodiment of the present invention. FIG. 4 is block view illustrating testing equipment and semiconductor devices that are tested by the testing equipment.

Referring to FIG. 3, a test operation may be performed on semiconductor devices 410_0 to 410_3 in step S310. The test operation may be performed by applying a series of control signals TEST_CTRLS used for the testing equipment 400 to perform a test on the semiconductor devices 410_0 to 410_3. For example, when the semiconductor devices 410_0 to 410_3 are memory devices, the testing equipment 400 may apply control signals that are used for the semiconductor devices 410_0 to 410_3 to perform write operations or read operations to check whether the semiconductor devices 410_0 to 410_3 operate normally. The decision of pass or failure resulting from the test operation may be made by test circuits (not shown) disposed inside of the semiconductor devices 410_0 to 410_3.

After the test operation, the test result may be temporarily stored in latch circuits (not shown) inside of the semiconductor devices 410_0 to 410_3 in step S320. The test result may come out in the form of a pass or failure. FIG. 4 shows a case in which a test result of 'pass' is temporarily stored in the semiconductor devices 410_0 and 410_3 and the test result of 'failure' is temporarily stored in the semiconductor devices 410_1 and 410_2.

In step S330, a pass program command PASS_PGM and a data DATA1 corresponding to the pass program command PASS_PGM may be transmitted from the testing equipment 400 to the semiconductor devices 410_0 to 410_3. The pass program command PASS_PGM is a command for programming the data DATA1 in the non-volatile memory circuits of the semiconductor devices 410_0 and 410_3 whose test result is 'pass'. Therefore, the data DATA1 may be programmed in the non-volatile memory circuits of the semiconductor devices 410_0 and 410_3 whose test result is 'pass' in step S340. The pass program command PASS_PGM and the data DATA1 may be disregarded in the semiconductor devices 410_1 and 410_2 whose test result is 'failure'.

A failure program command FAIL_PGM and a data DATA2 corresponding to the failure program command FAIL_PGM may be transmitted from the testing equipment 400 to the semiconductor devices 410_0 to 410_3 in step S350. The failure program command FAIL_PGM is a command for programming the data DATA2 in the non-volatile memory circuits of the semiconductor devices 410_1 and 410_2 whose test result is 'failure'. Therefore, the data DATA2 may be programmed in the non-volatile memory circuits of the semiconductor devices 410_1 and 410_2 whose test result is 'failure' in step S360. The failure program command FAIL_PGM and the data DATA2 may be disregarded in the semiconductor devices 410_0 and 410_3 whose test result is 'pass'.

The steps S330 and S340 and the steps S350 and S360 may all be performed, or either of the steps S330 and S340 or the steps S350 and S360 may be performed. When all the steps S330, S340, S350 and S360 are performed, the steps S330 and S340 may be performed prior to the steps S350 and S360, or the steps S350 and S360 may be performed prior to the steps S330 and S340. An address for designating the place (which is the position in the inside of the non-volatile memory circuit) where the data is to be programmed in the steps S330 and S350 may be transmitted from the testing equipment 400 to the semiconductor devices 410_0 to 410_3.

The method of FIG. 3 allows the information reflecting the test result to be programmed in the non-volatile memory circuits of the semiconductor devices 410_0 to 410_3 without analyzing the test result of each of the semiconductor devices 410_0 to 410_3. In addition, according to the method of FIG. 3, the pass/failure result may never be communicated outside of the semiconductor device. For example, after the semiconductor devices 410_0 to 410_3 are tested to see if the semiconductor devices 410_0 to 410_3 operate at a fast speed, e.g., 1 Ghz, information for setting up the semiconductor devices 410_0 and 410_3 which have passed the test to operate at a fast speed, e.g., 1 Ghz, is programmed in the non-volatile memory circuits of the semiconductor devices 410_0 and 410_3 and information for setting up the semiconductor devices 410_1 and 410_2 which have failed the test and operate at a low speed, e.g., 700 Mhz, is programmed in the non-volatile memory circuits of the semiconductor devices 410_1 and 410_2, without history management.

Figure 5:
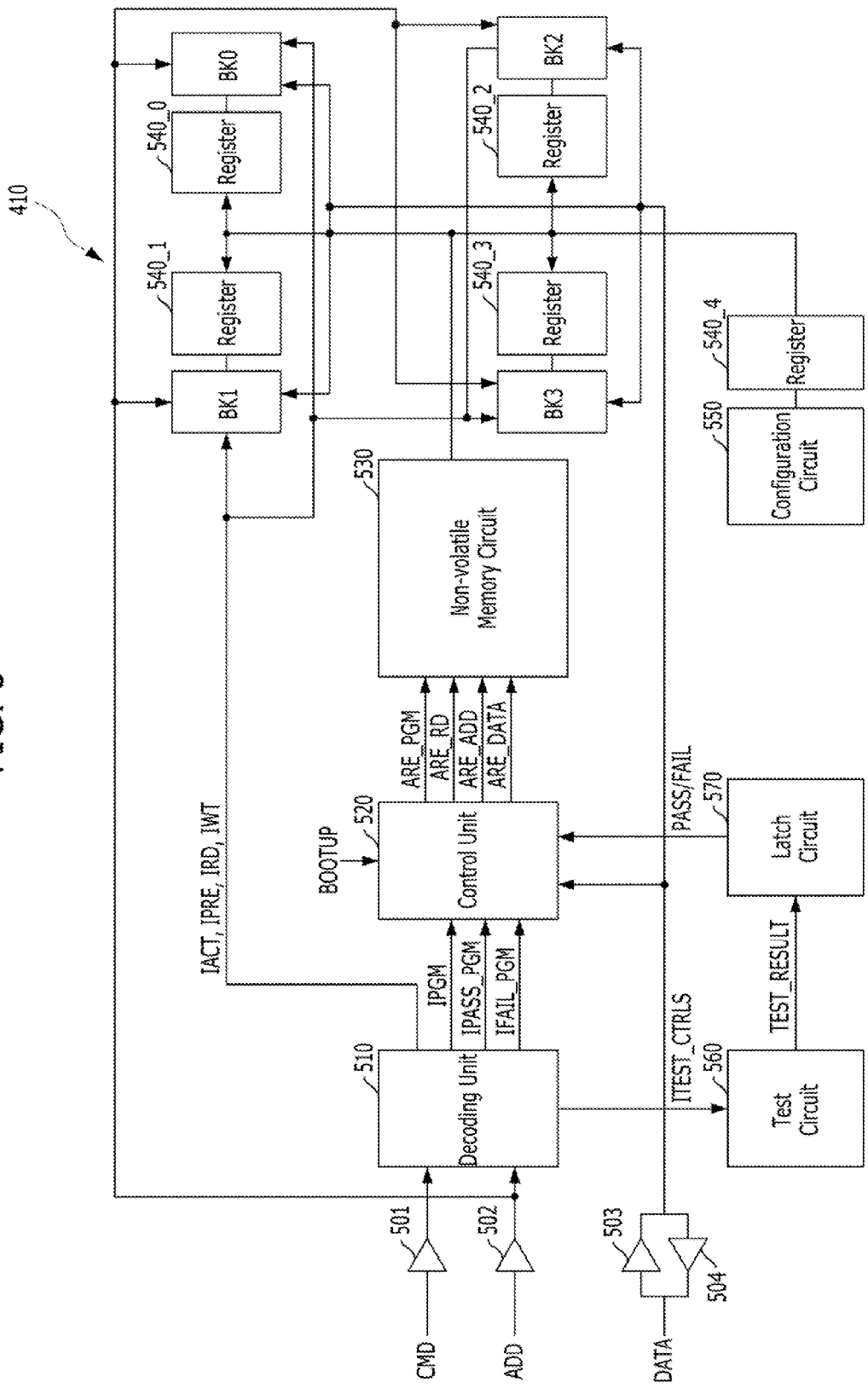
FIG. 5 is block view illustrating a semiconductor device 410 in accordance with an embodiment of the present invention.

FIG. 5 is block view illustrating a semiconductor device 410 in accordance with an embodiment of the present invention. In FIG. 5, it is assumed that the semiconductor device 410 is a memory device.

Referring to FIG. 5, the semiconductor device 410 may include a command receiving unit 501, an address receiving unit 502, a data receiving unit 503, a data transmitting unit 504, a decoding unit 510, a control unit 520, a non-volatile memory circuit 530, registers 540_0 to 540_4, memory banks BK0 to BK3, a configuration circuit 550, a test circuit 560, and a latch circuit 570. Herein, the command receiving unit 501, the address receiving unit 502, the data receiving unit 503, and the data transmitting unit 504 are named based on the memory banks BK0 to BK3. For example, although data to be stored in the memory banks BK0 to BK3 may be inputted through the data receiving unit 503, an address may be inputted as well based on the non-volatile memory circuit 530.

The command receiving unit 501 may receive a command CMD inputted from the exterior of the semiconductor device 410. The command CMD may include a chip selection signal CS, an active signal ACT, a Row Address Strobe (RAS) signal RAS, a Column Address Strobe (CAS) signal CAS, and a write enable signal WE.

The address receiving unit 502 may receive a multi-bit address ADD that is inputted from the exterior of the semiconductor device 410. A row address for selecting a row and a column address for selecting a column may be inputted through the same pad, and the memory device 410 may recognize the address ADD that is inputted in synchronization with the row address strobe signal RAS as a row address. The semiconductor device 410 may recognize the address ADD that is inputted in synchronization with the column address strobe signal CAS as a column address. The command receiving unit 501 and the address receiving unit 502 may receive the control signals TEST_CTRLS, the pass program command PASS_PGM, and the failure program command FAIL_PGM in the form of the command CMD and the address ADD.

The data receiving unit 503 may receive multi-bit data DQ inputted from the exterior of the semiconductor device 410, and the data transmitting unit 504 may transmit data to the exterior of the semiconductor device 410. Data to be written in the memory banks BK0 to BK3 may be received through the data receiving unit 503, and the data read out of the memory banks BK0 to BK3 may be outputted through the data transmitting unit 504.

The decoding unit 510 generates diverse internal commands by decoding the command CMD that is received through the command receiving unit 501. When the decoding unit 510 generates the internal commands, not only the command CMD that is received through the command receiving unit 501 but also a portion of the address ADD that is received through the address receiving unit 502 may be used. Among the internal commands generated by the decoding unit 510 are an internal active command IACT, an internal precharge command IPRE, an internal read command IRD, and an internal write command IWT. Meanwhile, the decoding unit 510 may generate internal control signals ITEST_CTRLS for controlling a test operation of the semiconductor device 410, and it may also generate internal program commands IPGM, IPASS_PGM and IFAIL_PGM related to the non-volatile memory circuit 530. The internal program commands IPGM, IPASS_PGM and IFAIL_PGM may be internal commands for programming (writing) information inputted from the exterior of the semiconductor device 410 in the non-volatile memory circuit 530.

The memory banks BK0 to BK3 may perform an operation of reading/writing an active command, a precharge command, and data under the control of the decoding unit 510. During a write operation, data inputted through the data receiving unit 503 from the exterior of the semiconductor device 410 may be programmed in the memory banks BK0 to BK3. During a read operation, data read from the memory banks BK0 to BK3 may be outputted to the exterior of the semiconductor device 410. The memory bank and a memory cell in the memory bank that is accessed during a read operation and a write operation may be selected based on the address ADD. The memory bank BK0 may be repaired based on the repair information stored in the register 540_0, and the memory bank BK1 may be repaired based on the repair information stored in the register 540_1. Likewise, the memory banks BK2 and BK3 may be repaired based on the repair information stored in the registers 540_2 and 540_3, respectively.

The configuration circuit 550 may perform an operation of setting up diverse setup values, such as internal voltage levels and latencies, which are to be used for the operation of the semiconductor device 410, based on the configuration information stored in the register 540_4.

The test circuit 560 may perform a test operation based on the internal control signals ITEST_CTRLS, which are generated by the decoding unit 510 by decoding the command CMD and the address ADD. The test operation may include diverse operations for verifying whether the semiconductor device 410 operates normally. For example, it is possible to verify whether an active operation, a read operation, and/or a write operation are performed normally in a memory device. The test result TEST_RESULT of the test circuit 560 may come out in the form of pass or failure, and the test result TEST_RESULT may be stored in the latch circuit 570.

The non-volatile memory circuit 530 may store repair information (i.e., failure addresses) for repairing the memory banks BK0 to BK3 and configuration information used for a setup operation. The process of transmitting the information stored in the non-volatile memory circuit 530 to the registers 540_0 to 540_4 and storing the information in the registers 540_0 to 540_4 is referred to a bootup operation. The information stored in the non-volatile memory circuit 530 is not used immediately, but it is transmitted to and stored in the registers 540_0 to 540_4 where it will be used. This is because the non-volatile memory circuit 530 is formed in an array and non-volatile memory generally has relatively slow operating speeds. Therefore, it takes a relatively long time to read the data stored in the non-volatile memory circuit 530. However, the repair information and the configuration information have to be used immediately. Therefore, the bootup operation for transmitting the information BOOTUP_DATA stored in the non-volatile memory circuit 530 to the registers 540_0 to 540_4 is performed, and after the bootup operation, the repair information and the configuration information stored in the registers 540_0 to 540_4 is used in the memory banks BK0 to BK3 and the configuration circuit 550. The non-volatile memory circuit 530 may be any one of the non-volatile memory circuits, such as an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), a Phase-Change Random Access Memory (PCRAM) and so forth as disclosed in U.S. Pat. No. 6,940,751, U.S. Pat. No. 6,777,757, U.S. Pat. No. 6,667,902, U.S. Pat. No. 7,173,851, and U.S. Pat. No. 7,269,047. Since the non-volatile memory circuit 530 stores information used for the operation of the semiconductor device 410, the capacity of the non-volatile memory circuit 530 may be relatively small. For example, when giga bits of data are stored in the memory banks BK0 to BK3, several to tens of mega bits of data may be stored in the non-volatile memory circuit 530.

The control unit 520 may control the program operation of the non-volatile memory circuit 530 and the bootup operation in which the data stored in the non-volatile memory circuit 530 is transmitted to the registers 540_0 to 540_4.

When a normal program command IPGM is activated, the control unit 520 may activate a program signal ARE_PGM for programming the non-volatile memory circuit 530 and apply an address ARE_ADD and a data ARE_DATA to the non-volatile memory circuit 530. When the program signal ARE_PGM is activated, the data ARE_DATA may be programmed in a position designated by the address ARE_ADD inside of the non-volatile memory circuit 530. The address ARE_ADD and the data ARE_DATA to be applied to the non-volatile memory circuit 530 may be received through the data receiving unit 503. Since the non-volatile memory circuit 530 has a relatively small capacity, it is possible to receive both the address ARE_ADD and the data ARE_DATA through the data receiving unit 503. The control unit 520 may divide a signal received through the data receiving unit 503 into the address ARE_ADD and the data ARE_DATA. For example, when a 24-bit signal is received through the data receiving unit 503, the control unit 520 recognizes 8 bits of the signal as the address ARE_ADD, 12 bits of the signal as the data ARE_DATA, and the remaining 4 bits of the signal as a preliminary signal for the address ARE_ADD and the data ARE_DATA. Although FIG. 5 shows a case in which the address ARE_ADD and the data ARE_DATA are received through the data receiving unit 503, it is obvious to those skilled in the art that the address ARE_ADD and the data ARE_DATA may be received through a receiving circuit (e.g., the command receiving unit 501 or an address receiving unit 502) other than the data receiving unit 503.

When the pass program command IPASS_PGM is activated, the control unit 520 is able to decide whether to program the non-volatile memory circuit 530 based on the test result, which is either pass or failure, stored in the latch circuit 570. When the test result stored in the latch circuit 570 turns out to be 'pass', the control unit 520 may activate the program signal ARE_PGM for programming the non-volatile memory circuit 530 and apply the address ARE_ADD and a data ARE_DATA to the non-volatile memory circuit 530. In short, when the test result stored in the latch circuit 570 is 'pass' and the pass program command IPASS_PGM is activated, the control unit 520 may operate the same as when the normal program command IPGM is activated. However, when the test result stored in the latch circuit 570 is 'failure' and the pass program command IPASS_PGM is activated, the control unit 520 may disregard the pass program command IPASS_PGM.

When the failure program command IFAIL_PGM is activated, the control unit 520 is able to decide whether to program the non-volatile memory circuit 530 based on the test result, which is either pass or failure, stored in the latch circuit 570. When the test result stored in the latch circuit 570 turns out to be 'failure', the control unit 520 may activate the program signal ARE_PGM for programming the non-volatile memory circuit 530 and apply the address ARE_ADD and a data ARE_DATA to the non-volatile memory circuit 530. In short, when the test result stored in the latch circuit 570 is 'failure' and the failure program command IFAIL_PGM is activated, the control unit 520 may operate the same as when the normal program command IPGM is activated. However, when the test result stored in the latch circuit 570 is 'pass' and the failure program command IFAIL_PGM is activated, the control unit 520 may disregard the failure program command IFAIL_PGM.

In other words, when the normal program command IPGM is activated among the internal program commands IPGM, IPASS_PGM and IFAIL_PGM, a program operation of the non-volatile memory circuit 530 is performed regardless of the test result, which is either pass or failure. When the pass program command IPASS_PGM is activated, the program operation of the non-volatile memory circuit 530 may be performed only when the test result turns out to be 'pass'. When the failure program command IFAIL_PGM is activated, the program operation of the non-volatile memory circuit 530 may be performed only when the test result turns out to be 'failure'.

During a bootup operation where the bootup signal BOOTUP is activated, the control unit 520 may control the non-volatile memory circuit 530 to transmit the information stored inside of the non-volatile memory circuit 530 to the registers 540_0 to 540_4. The control unit 520 may periodically activate a read signal ARE_RD for having the non-volatile memory circuit 530 perform a read operation, and whenever the read signal ARE_RD is activated, the control unit 520 changes the address ARE_ADD in such a manner that all the data inside of the non-volatile memory circuit 530 may be read. The bootup operation is generally performed in the initialization section of the semiconductor device 410. The address ARE_ADD applied to the non-volatile memory circuit 530 during the bootup operation may not be an external address received through the data receiving unit 503 but be an internal address generated by a counting method in the control unit 520.

Although the described embodiment discloses a memory device, the present invention may be applied to various semiconductor devices in addition to memory devices. When the semiconductor device 410 is not a memory device, circuits for performing the intrinsic functions of a semiconductor device instead of the memory banks BK0 to BK3 may be provided, and the commands IPGM, IPASS_PGM and IFAIL_PGM, the data ARE_DATA, and the address ARE_ADD for programming the non-volatile memory circuit 530 may be inputted through a pad that is different from the pad shown in FIG. 5.

Figure 6:
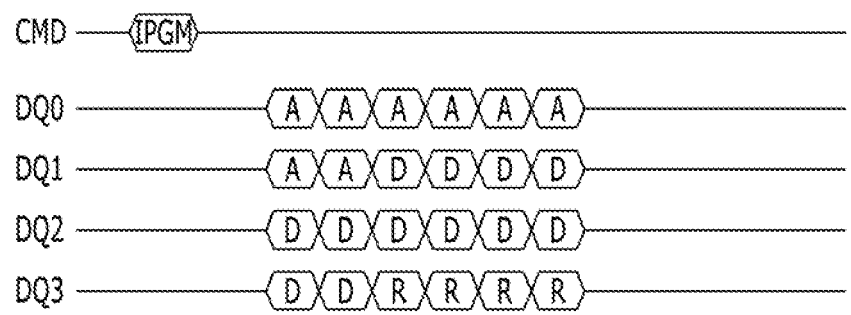
FIG. 6 illustrates a process of transmitting an address ARE_ADD and a data ARE_DATA to be used in a non-volatile memory circuit 530 to a data receiving unit 503.

FIG. 6 illustrates a process of transmitting an address ARE_ADD and a data ARE_DATA to be used in a non-volatile memory circuit 530 to a data receiving unit 503.

Referring to FIG. 6, when a normal program command IPGM is applied based on a command, the data receiving unit 503 may receive a 24-bit signal for the non-volatile memory circuit 530 that is inputted through 4 data pads DQ0 to DQ3. Herein, signals denoted as 'A' may be signals of 8 bits that constitute an address ARE_ADD, and the signals denoted as 'D' may be signals of 12 bits that constitute a data ARE_DATA. Signals denoted as 'R' are reserved signals to cope with a case when the number of the bits of the address ARE_ADD and/or the data ARE_DATA is increased.

Although FIG. 6 shows the process of receiving the address ARE_ADD and the data ARE_DATA after the normal program command IPGM is applied, it is obvious to those skilled in the art that a process of receiving the address ARE_ADD and the data ARE_DATA after the pass program command IPASS_PGM and the failure program command IFAIL_PGM are applied may be performed in the same manner.

According to the embodiments of the present invention, information generated based on a test result of a semiconductor device may be easily programmed in a non-volatile memory circuit of the semiconductor device.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a latch circuit suitable for storing a test result;
   a non-volatile memory circuit suitable for storing information used for an operation of the semiconductor device;
   a decoding unit suitable for generating a pass program command and a failure program command by using one or more control signals; and
   a control unit suitable for programming information inputted from an exterior of the semiconductor device in the non-volatile memory circuit when the pass program command is activated and the test result indicates pass, and programming the information inputted from the exterior of the semiconductor device in the non-volatile memory circuit when the failure program command is activated and the test result indicates failure.

2. The semiconductor device of claim 1, wherein the control signals are inputted from the exterior of the semiconductor device.

3. The semiconductor device of claim 2, wherein the semiconductor device includes a memory device, and
   at least one between configuration information and repair information is stored in the non-volatile memory circuit.

4. The semiconductor device of claim 1, wherein the control unit does not program the information inputted from the exterior of the semiconductor device in the non-volatile memory circuit, when the pass program command is activated and the test result indicates failure.

5. The semiconductor device of claim 1, wherein the control unit does not program the information inputted from the exterior of the semiconductor device in the non-volatile memory circuit, when the failure program command is activated and the test result indicates pass.

6. A semiconductor device, comprising:
   a latch circuit suitable for storing a test result corresponding to a pass or failure;
   a non-volatile memory circuit; and
   a control unit suitable for programming information in the non-volatile memory circuit when a pass program command is activated and the test result corresponds to pass, and programming the information in the non-volatile memory circuit when a failure program command is activated and the test result corresponds to fail.

7. The semiconductor device of claim 6, wherein the information is inputted from an exterior of the semiconductor device.

8. A method for operating a semiconductor device, comprising:
   performing a test to produce a test result;
   temporarily storing the test result;
   receiving a program command and information corresponding to the program command; and
   programming the information in a non-volatile memory circuit based on the temporarily stored test result,
   wherein, in the programming of the information in the non-volatile memory circuit based on the temporarily stored test result,
   the information is programmed in the non-volatile memory circuit when the program command is a pass program command and the temporarily stored test result is information of pass, and
   when the program command is a pass program command and the temporarily stored test result is information of failure, the information is not programmed in the non-volatile memory circuit.

9. The method of claim 8, wherein, in the programming of the information in the non-volatile memory circuit based on the temporarily stored test result,
   the information is programmed in the non-volatile memory circuit, when the program command is a failure program command and the temporarily stored test result is information of failure, and
   when the program command is a failure program command and the temporarily stored test result is information of pass, the information is not programmed in the non-volatile memory circuit.

* * * * *